(12) United States Patent
Lee et al.

(10) Patent No.: US 10,734,457 B2
(45) Date of Patent: Aug. 4, 2020

(54) ORGANIC LIGHT-EMITTING DISPLAY DEVICE AND METHOD OF MANUFACTURING THE SAME

(71) Applicant: LG Display Co., Ltd., Seoul (KR)

(72) Inventors: YongBaek Lee, Anyang-si (KR); ChoongKeun Yoo, Gimpo-si (KR); Dongyoung Kim, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 184 days.

(21) Appl. No.: 15/790,545

(22) Filed: Oct. 23, 2017

(65) Prior Publication Data

US 2018/0122864 A1 May 3, 2018

(30) Foreign Application Priority Data

Oct. 28, 2016 (KR) .......................... 10-2016-0141602

(51) Int. Cl.
| | |
|---|---|
| *G06G 1/00* | (2006.01) |
| *H01L 27/32* | (2006.01) |
| *G06F 3/041* | (2006.01) |
| *G06F 3/044* | (2006.01) |
| *H01L 51/52* | (2006.01) |

(52) U.S. Cl.
CPC ............ *H01L 27/323* (2013.01); *G06F 3/044* (2013.01); *G06F 3/0412* (2013.01); *H01L 51/5281* (2013.01); *G06F 2203/04111* (2013.01); *G06F 2203/04112* (2013.01); *H01L 27/3244* (2013.01); *H01L 2227/323* (2013.01)

(58) Field of Classification Search
CPC .......... G06F 3/044; G06F 3/0354; G06F 3/14; G06F 3/041; H01L 51/50; H01L 51/52
See application file for complete search history.

(56) References Cited

U.S. PATENT DOCUMENTS

| | | | |
|---|---|---|---|
| 2016/0111485 A1* | 4/2016 | Chida .................. | H01L 27/322 257/40 |
| 2016/0154500 A1* | 6/2016 | Baek ...................... | G06F 3/044 29/622 |
| 2017/0115770 A1* | 4/2017 | Han ....................... | G06F 3/044 |

\* cited by examiner

*Primary Examiner* — Michael A Faragalla
(74) *Attorney, Agent, or Firm* — Morgan, Lewis & Bockius LLP

(57) ABSTRACT

An organic light-emitting display device and a method of manufacturing the same are provided. An organic light-emitting display device includes: a substrate; a pixel array layer on the substrate, the pixel array layer including a plurality of pixels, each of the plurality of pixels including an organic light-emitting device, an encapsulation layer covering the pixel array layer, and a touch sensing layer on the encapsulation layer, the touch sensing layer including: a plurality of first touch electrodes, and a plurality of second touch electrodes, wherein the plurality of first and second touch electrodes each include: a transparent conductive layer on an upper surface of the encapsulation layer, and a mesh metal layer on the transparent conductive layer, the mesh metal layer including at least three metal layers.

18 Claims, 5 Drawing Sheets

ORGANIC LIGHT-EMITTING DISPLAY DEVICE AND METHOD OF MANUFACTURING THE SAME

CROSS-REFERENCE TO RELATED APPLICATIONS

This application claims the priority of Korean Application No. 10-2016-0141602, filed on Oct. 28, 2016, the entirety of which is hereby incorporated by reference.

BACKGROUND

1. Technical Field

The present disclosure relates to an organic light-emitting display device, and, more particularly, to an organic light-emitting display device including a touch sensor, and a method of manufacturing the same.

2. Discussion of the Related Art

Touch screens are input devices that enable a user command to be input by selecting an instruction displayed on a screen of a display device with the user's finger or an object. That is, touch screens convert a touch position, directly contacting a person's finger or an object, into an electrical signal, and an instruction selected at the touch position is recognized as an input signal. The touch screens can replace a separate input device that is connected to a display device to operate, such as keyboards and mouse devices. Thus, the use range of the touch screens is progressively expanding.

Generally, the touch screen is attached on a front surface of a display panel, such as a liquid crystal display panel or an organic light-emitting display panel, by an adhesive. A display device with a touch screen attached thereon blocks inflow of external light using a polarizer for preventing image quality from being degraded by light incident from the outside.

However, in the related art display device, because external light is reflected by the polarizer, a screen looks like a mirror when outdoors. For this reason, image visibility is reduced when outdoors, causing the degradation in image quality.

SUMMARY

Accordingly, the present disclosure is directed to an organic light-emitting display device and a method of manufacturing the same that substantially obviate one or more of the issues due to limitations and disadvantages of the related art.

In one aspect, embodiments of the present disclosure may provide an organic light-emitting display device with enhanced image quality.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an organic light-emitting display device, including: a substrate; a pixel array layer on the substrate, the pixel array layer including a plurality of pixels, each of the plurality of pixels including an organic light-emitting device, an encapsulation layer covering the pixel array layer, and a touch sensing layer on the encapsulation layer, the touch sensing layer including: a plurality of first touch electrodes, and a plurality of second touch electrodes, wherein the plurality of first and second touch electrodes each include: a transparent conductive layer on an upper surface of the encapsulation layer, and a mesh metal layer on the transparent conductive layer, the mesh metal layer including at least three metal layers.

In another aspect, there is provided an organic light-emitting display device, including: providing a substrate; providing a pixel array layer on the substrate, the providing the pixel array layer comprising providing a plurality of pixels, each of the plurality of pixels comprising an organic light-emitting device; covering the pixel array layer with an encapsulation layer; and providing a touch sensing layer on the encapsulation layer, the providing the touch sensing layer comprising: providing a plurality of first touch electrodes; and providing a plurality of second touch electrodes, wherein the providing the plurality of first and second touch electrodes each comprise: providing a transparent conductive layer on an upper surface of the encapsulation layer, and providing a mesh metal layer on the transparent conductive layer, the mesh metal layer comprising at least three metal layers.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
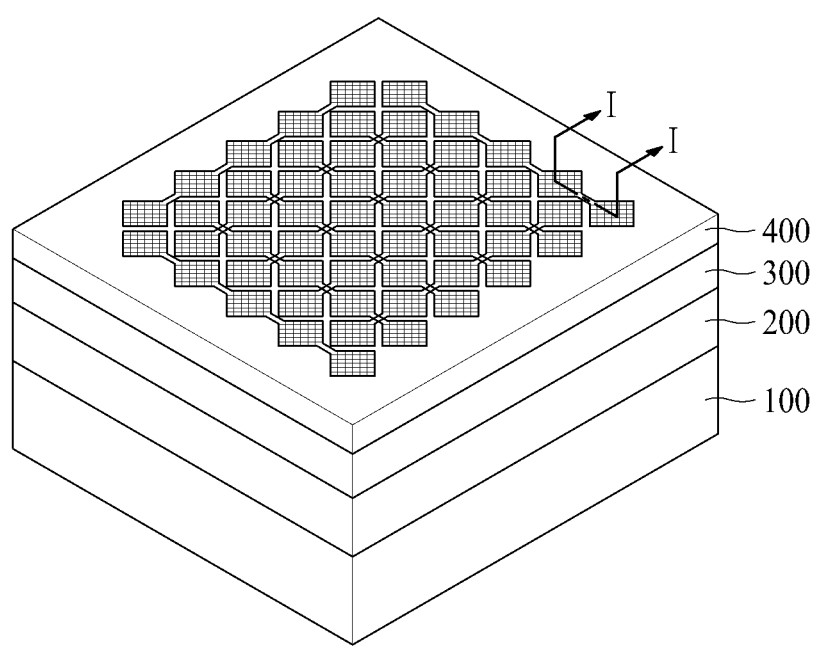
FIG. 1 is a perspective view illustrating an organic light-emitting display device according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to some embodiments of the present disclosure, examples of that may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

FIG. 1 is a perspective view illustrating an organic light-emitting display device according to an embodiment of the present disclosure.

With reference to the FIG. 1 example, the organic light-emitting display device according to an embodiment of the present disclosure may include a substrate 100, a pixel array layer 200, an encapsulation layer 300, and a touch sensing layer 400. The substrate 100, which may be a base substrate, may include, e.g., one or more of: a plastic material, a glass material, or the like. The substrate 100 according to an embodiment may include a flexible plastic material, and, for example, may include opaque or colored polyimide (PI). The substrate 100 according to an embodiment may be manufactured by curing polyimide resin that may be coated on an upper surface of a release layer provided on a relatively thick carrier substrate to have a particular thickness. Here, the carrier substrate may be separated from the substrate 100 by releasing the release layer, e.g., through a laser release process.

Additionally, the organic light-emitting display device according to an embodiment of the present disclosure may further include a back plate that may be coupled to a bottom of the substrate 100 with respect to a vertical axis direction (or a thickness direction of the substrate 100). The back plate may maintain the substrate 100 in a planar state. The back plate according to an embodiment may include a plastic material, for example, polyethyleneterephthalate (PET). The back plate may be laminated on the bottom of the substrate 100 separated from the carrier substrate, thereby maintaining the first substrate 110 in a planar state.

The pixel array layer 200 may include a plurality of pixels that are provided on the substrate 100 to display an image. The plurality of pixels may be respectively provided in a plurality of pixel areas defined by a plurality of gate lines, a plurality of data lines, and a plurality of pixel driving power lines. Each of the plurality of pixels may be an area corresponding to a minimum unit in which actual light is emitted, and may be defined as a subpixel. At least three adjacent pixels may configure one unit pixel for displaying a color. For example, the one unit pixel may include a red pixel, a green pixel, and a blue pixel that may be adjacent to each other, and may further include a white pixel for enhancing luminance.

Each of the pixels according to an embodiment may include a pixel circuit. The pixel circuit may be provided in a circuit area defined in a corresponding pixel, and may be connected to a gate line, a data line, and a pixel driving power line that may be adjacent thereto. The pixel circuit may control a current flowing in an organic light-emitting device according to a data signal supplied through the data line in response to a scan pulse supplied through the gate line, based on a pixel driving power supplied through the pixel driving power line. The pixel circuit according to an embodiment may include a switching thin film transistor (TFT), a driving TFT, and a capacitor.

The switching TFT and the driving TFT may each include a gate insulation layer, an active layer, a gate electrode, a source electrode, and a drain electrode. Here, the switching TFT and the driving TFT may each be an amorphous silicon (a-Si) TFT, a poly-Si TFT, an oxide TFT, an organic TFT, or the like.

The switching TFT may include a gate electrode connected to the gate line, a first electrode connected to the data line, and a second electrode connected to a gate electrode of the driving TFT. Here, each of the first and second electrodes of the switching TFT may be a source electrode or a drain electrode depending on a direction of a current. The switching TFT may be turned on by the scan pulse supplied through the gate line and may supply the data signal, supplied through the data line, to the driving TFT.

The driving TFT may be turned on by a voltage supplied through the switching TFT and/or a voltage of the capacitor and may control the amount of current flowing from the pixel driving power line to the organic light-emitting device. To this end, the driving TFT according to an embodiment may include the gate electrode connected to the second electrode of the switching TFT, a source electrode connected to the pixel driving power line, and a drain electrode connected to the organic light-emitting device. The driving TFT may control a data current flowing from the pixel driving power line to the organic light-emitting device, based on the data signal supplied through the switching TFT, thereby allowing the organic light-emitting device to emit light having a brightness proportional to the data signal.

The capacitor may be provided in an overlap area between the gate electrode and the source electrode of the driving TFT. The capacitor may store a voltage corresponding to the data signal supplied to the gate electrode and may turn on the driving TFT with the stored voltage.

In addition, the organic light-emitting display device according to an embodiment of the present disclosure may further include a scan driving circuit that may be provided in a non-display area of the substrate 100. The scan driving circuit may generate the scan pulse according to a gate control signal input thereto, and may supply the scan pulse to the gate line. The scan driving circuit according to an embodiment may be provided in an arbitrary non-display area, enabling the scan pulse to be supplied to the gate line of the non-display area provided on the substrate 100 along with a TFT of the pixel.

The encapsulation layer 300 may be formed to cover the pixel array layer 200 for reducing or preventing penetration of water from each pixel to protect the organic light-emitting device that may be vulnerable to external water or oxygen. That is, the encapsulation layer 300 may be provided on the substrate 100 to cover the below-described second electrode.

The encapsulation layer 300 according to an embodiment may be formed of an inorganic material layer or an organic material layer, or may be formed in a multi-layer structure in which an inorganic material layer and an organic material layer may be alternately stacked.

For sensing a position of a user touch, the touch sensing layer 400 may be directly provided on the encapsulation layer 300 of the organic light-emitting display panel. That is, the touch sensing layer 400 may not be separately manufactured, and may not be indirectly coupled to an upper surface of the encapsulation layer 300 by a separate optical adhesive. In this case, the touch sensing layer 400 may be directly formed on the encapsulation layer 300.

Figure 2:
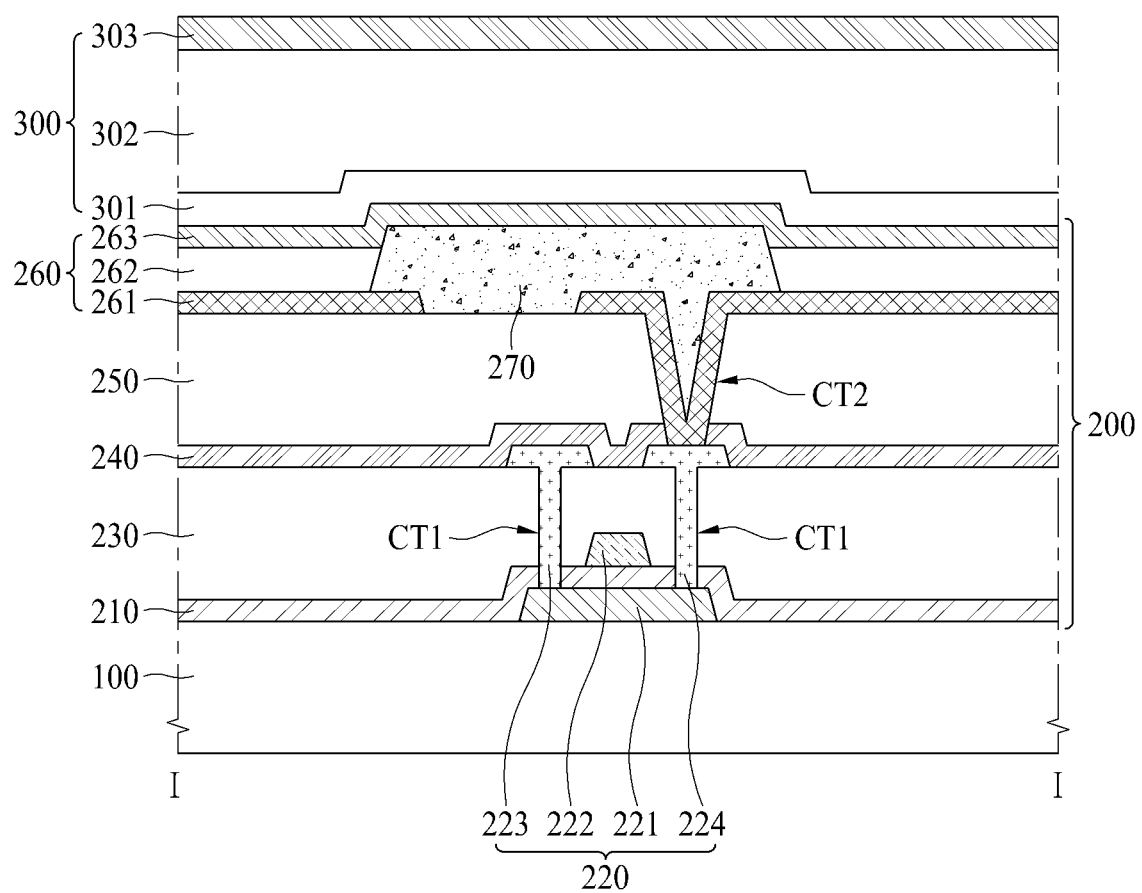
FIG. 2 is a cross-sectional view taken along line I-I of FIG. 1, and illustrates a substrate, a pixel array layer, and an encapsulation layer according to an embodiment of the present disclosure.

FIG. 2 is a cross-sectional view taken along line I-I of FIG. 1, and illustrates a substrate, a pixel array layer, and an encapsulation layer according to an embodiment of the present disclosure.

With reference to the FIG. 2 example, a pixel array layer 200 according to an embodiment of the present disclosure may include a gate insulation layer 210, a TFT 220, an interlayer dielectric 230, a passivation layer 240, a planarization layer 250, an organic light-emitting device 260, and a bank 270. The TFT 220 may include an active layer 221, a gate electrode 222, a source electrode 223, and a drain electrode 224.

The active layer 221 may be disposed on the substrate 100. The active layer 221 may include, for example, a silicon-based semiconductor material or an oxide-based semiconductor material. A light blocking layer for blocking external light incident on the active layer 221 and a buffer layer for protecting the TFT 220 and the organic light-emitting device 260 from water may be additionally provided under the active layer 221.

The gate insulation layer 210 may be formed on the active layer 221. The gate insulation layer 220 may include an inorganic layer, for example, silicon oxide ($SiO_x$), silicon nitride ($SiN_x$), or a multilayer thereof.

The gate electrode 222 may be disposed on the gate insulation layer 210. A gate line may be formed on the gate insulation layer 210. The gate electrode 222 and the gate line may each include a single layer or a multilayer that may include, for example, one or more of molybdenum (Mo), aluminum (Al), chromium (Cr), gold (Au), titanium (Ti), nickel (Ni), neodymium (Nd), copper (Cu), or an alloy of any thereof.

The interlayer dielectric 230 may be formed on the gate electrode 222. The interlayer dielectric 230 may be formed of an inorganic layer, for example, $SiO_x$, $SiN_x$, or a multilayer thereof.

The source electrode 223 and the drain electrode 224 may be disposed on the interlayer dielectric 230. A data line may be disposed on the interlayer dielectric 230. The source electrode 223 may contact the active layer 221 through a contact hole CT1 which passes through the gate insulation layer 210 and the interlayer dielectric 230. The drain electrode 224 may contact the active layer 221 through another contact hole CT1 that may pass through the gate insulation layer 210 and the interlayer dielectric 230. The source electrode 223, the drain electrode 224, and the data line may each include, for example, a single layer or a multilayer that may include, e.g., one or more of Mo, Al, Cr, Au, Ti, Ni, Nd, Cu, or an alloy of any thereof.

In FIG. 2, the TFT 220 is illustrated as having a top-gate type in which the gate electrode 222 is disposed on the active layer 221, but embodiments are not limited thereto. In other embodiments, the TFT 220 may be formed as a bottom-gate type in which the gate electrode 222 is disposed under the active layer 221, or may be a double-gate type in which the gate electrode 222 is disposed both on and under the active layer 221.

The passivation layer 240 may be disposed on the source electrode 223, the drain electrode 224, and the data line. The passivation layer 240 may insulate the TFT 220. The passivation layer 240 may be formed of an inorganic layer, for example, $SiO_x$, $SiN_x$, or a multilayer thereof.

The planarization layer 250 may be formed on the passivation layer 240. The planarization layer 250 may planarize a step height caused by the TFT 220 on the passivation layer 240. The planarization layer 250 may be formed of an organic layer, such as acryl resin, epoxy resin, phenolic resin, polyamide resin, polyimide resin, or the like.

The organic light-emitting device 260 and the bank 270 may be disposed on the planarization layer 250. The organic light-emitting device 260 may include a first electrode 261, an organic light-emitting layer 262, and a second electrode 263. The first electrode 261 may be an anode electrode, and the second electrode 263 may be a cathode electrode.

The first electrode 261 may be disposed on the planarization layer 250. The first electrode 261 may be connected to the drain electrode 224 of the TFT 220 through a contact hole CT2 passing through the passivation layer 240 and the planarization layer 250. The first electrode 261 may be formed of a conductive material, which may be high in reflectance, such as a stacked structure (Ti/Al/Ti) of Al and Ti, a stacked structure (ITO/Al/ITO) of Al and indium tin oxide (ITO), an APC alloy, a stacked structure (ITO/APC/ITO) of an APC alloy and ITO, or the like. The APC alloy may be, for example, an alloy of silver (Ag), palladium (Pd), and Cu.

The bank 270 may be disposed on the planarization layer 250 to overlap the first electrode 261. The bank 270 may be disposed on the first electrode 261 in the contact hole CT2. An emissive area of the pixel may be defined as an area in which the first electrode 261, the organic light-emitting layer 262, and the second electrode 263 are sequentially stacked to emit particular light. In this case, the first electrode 261, the organic light-emitting layer 262, and the second electrode 263 may be sequentially stacked in an area in which the bank 270 is not provided. Therefore, the bank 270 may divide the emissive area, and may define the emissive area.

The organic light-emitting layer 262 may be disposed on the first electrode 261. The organic light-emitting layer 262 may be a white light-emitting layer that may emit white light. In this case, the organic light-emitting layer 262 may be formed in a tandem structure of two or more stacks. Each of the stacks may include a hole transporting layer, at least one light-emitting layer, and an electron transporting layer. The organic light-emitting layer 262 may be formed in a deposition process or a solution process. In a case of being formed in the deposition process, the organic light-emitting layer 262 may be formed in an evaporation process.

The second electrode 263 may be disposed on the organic light-emitting layer 262. The second electrode 263 may be disposed on the bank 270. The second electrode 263 may be formed, for example, of a transparent conductive material (or TCO), such as indium tin oxide (ITO) or indium zinc oxide (IZO) capable of transmitting light, or a semi-transmissive conductive material, such as Mg, Ag, or an alloy of Mg and Ag. A capping layer may be disposed on the second electrode 263. The second electrode 263 may be formed, e.g., through a physical vapor deposition (PVD) process, such as a sputtering process.

The encapsulation layer 300 may be disposed on the second electrode 263. The encapsulation layer 300 may reduce or prevent oxygen or water from penetrating into the organic light-emitting layer 262 and the second electrode 263. As such, the encapsulation layer 300 may include at least one inorganic layer and at least one organic layer. The encapsulation layer 300 may be formed, e.g., through a physical vapor deposition (PVD) process, such as a sputtering process.

The encapsulation layer 300 according to an embodiment may include a first inorganic layer 301, an organic layer 302, and a second inorganic layer 303. In one example, the first inorganic layer 301 may be disposed on the second electrode 263 to cover the second electrode 263. The organic layer 302 may be disposed on the first inorganic layer 301 to cover the first inorganic layer 301. To reduce or prevent particles from penetrating into the organic light-emitting layer 262 and the second electrode 263 via the first inorganic layer 301, the organic layer 302 may have a sufficient thickness in consideration of preventing the penetration of the particles. The second inorganic layer 303 may be disposed on the organic layer 302 to cover the organic layer 302.

The first inorganic layer 301 may be disposed closest to the organic light-emitting device 260, and may be formed of an inorganic insulating material, which may be deposited at a low temperature, such as nitride silicon (SiN$_x$), oxide silicon (SiO$_x$), oxynitride silicon (SiON), oxide aluminum (Al$_2$O$_3$), or the like. In one example, because the organic light-emitting layer 262 may have a characteristic that may be vulnerable to a high temperature, the first inorganic layer 301 may be formed by a low temperature process using a low temperature atmosphere, for example, 100° (degrees) C. or less. Accordingly, in one embodiment, the organic light-emitting layer 260 may be prevented from being damaged by a high temperature atmosphere applied to a process chamber when forming the first inorganic layer 301.

The organic layer 302 may be provided on the substrate 100 to cover a whole upper surface of the first inorganic layer 301. The organic layer 302 may reduce a stress between layers caused by bending of the organic light-emitting display device. The organic layer 302 according to an embodiment may include an organic material, such as benzocyclobutadiene (BCB), acryl, polyimide, silicon oxycarbon (SiOC), or the like.

The second inorganic layer 303 may be provided on the substrate 100 to cover a whole upper surface of the organic layer 302 and each side surface of the first inorganic layer 301. The second inorganic layer 303 may reduce or prevent water or oxygen from penetrating into the organic layer 302 and the first inorganic layer 301 from the outside of the organic light-emitting display device. The second inorganic layer 303 according to an embodiment may be formed of an inorganic insulating material, which may be deposited at a low temperature, such as nitride silicon (SiN$_x$), oxide silicon (SiO$_x$), oxynitride silicon (SiON), oxide aluminum (Al$_2$O$_3$), or the like. The substrate 100, the pixel array layer 200, and the encapsulation layer 300 may configure an organic light-emitting display panel.

Figure 3:
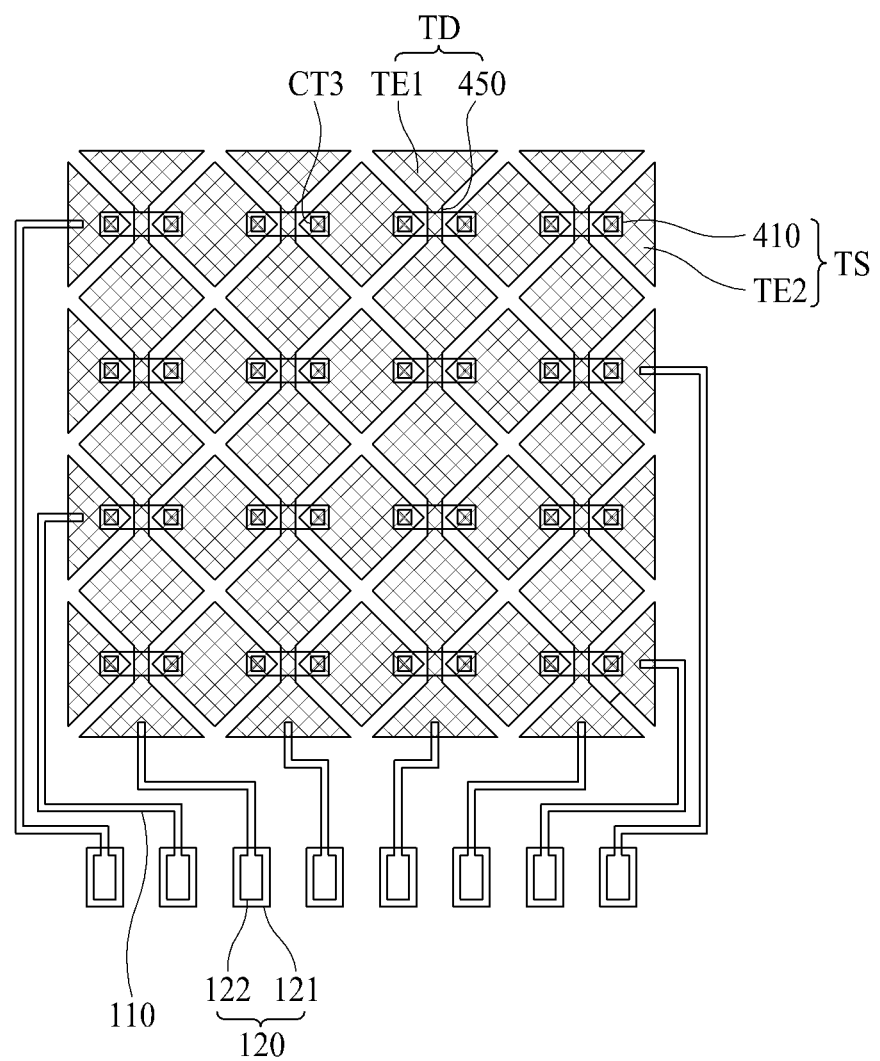
FIG. 3 is a plan view illustrating a touch sensing layer of an organic light-emitting display device according to an embodiment of the present disclosure.

FIG. 3 is a plan view illustrating a touch sensing layer of an organic light-emitting display device according to an embodiment of the present disclosure.

With reference to the FIG. 3 example, a touch sensing layer 400 according to an embodiment of the present disclosure may include a touch driving line TD and a touch sensing line TS that may be provided on the encapsulation layer 300. The touch driving line TD may include a plurality of first touch electrodes TE1 and a first bridge 450 that may electrically connect the plurality of first touch electrodes TE1.

The plurality of first touch electrodes TE1 may be arranged along a first direction, and may be spaced apart from each other by a particular interval. Each of the plurality of first touch electrodes TE1 may have a rectangular shape, an octagonal shape, a circular shape, a lozenge shape, or the like. Each of the plurality of first touch electrodes TE1 may be electrically connected to an adjacent first touch electrode TE1, e.g., through the first bridge 450.

The first bridge 450 may be electrically connected to the first touch electrodes TE1 without a separate contact hole. The touch sensing line TS may include a plurality of second touch electrodes TE2 and a second bridge 410 that may electrically connect the plurality of second touch electrodes TE2.

The plurality of second touch electrodes TE2 may be arranged along a second direction perpendicular to the first direction, and may be spaced apart from each other by a particular interval. Each of the plurality of second touch electrodes TE2 may have a rectangular shape, an octagonal shape, a circular shape, a lozenge shape, or the like. Each of the plurality of second touch electrodes TE2 may be electrically connected to an adjacent second touch electrode TE2, e.g., through the second bridge 410.

The second bridge 410 may be electrically connected to the second touch electrodes TE2 through a contact hole CT3. As described above, the touch sensing line TS may intersect the touch driving line TD with the touch insulation layer 420 therebetween. Thus, a mutual capacitor having a mutual capacitance may be provided in an intersection portion of the touch sensing line TS and the touch driving line TD. Accordingly, the mutual capacitor may be charged with an electric charge by a touch driving pulse supplied through the touch driving line TD, and may discharge the charged electric charge to the touch sensing line TS, thereby acting as a touch sensor.

Each of the touch driving line TD and the touch sensing line TS according to an embodiment of the present disclosure may be connected to a touch driver (not shown) through a routing line 110 and a touch pad 120. Therefore, the routing line 110 may transfer a touch driving pulse, generated by the touch driver, to the touch driving line TD through the touch pad 120, and may transfer a touch signal, supplied through the touch sensing line TS, to the touch pad 120. The routing line 110 may be disposed between the touch pad 120 and each of the first and second touch electrodes TE1 and TE2, and may be electrically connected to each of the first and second touch electrodes TE1 and TE2 without a separate contact hole.

The routing line 110 connected to the first touch electrode TE1 may extend to one side, and may be connected to the touch pad 120. The routing line 110 connected to the second touch electrode TE2 may extend to one side, and may be connected to the touch pad 120. A disposition of the routing line 110 is not limited to the structure of the example of FIG. 3, and may be variously modified, depending on a design of the display device.

The routing line 110 may be a single-layer or multi-layer structure using a first conductive layer, which may be strong in corrosion resistance and acid resistance, and may be good in conductivity, such as Al, Ti, Cu, Mo, or the like. For example, the routing line 110 may be a three-layer structure in which layers may be stacked, like Ti/Al/Ti or Mo/Al/Mo, or may be a multi-layer structure that may include a transparent conductive layer, which may have strong corrosion resistance and acid resistance, such as ITO or IZO, and an opaque conductive layer, which may have good conductivity, such as Ti/Al/Ti or Mo/Al/Mo.

The touch pad 120 may include a pad electrode 121 and a pad cover electrode 122 that may be disposed on the pad electrode 121 to cover the pad electrode 121. The pad electrode 121 may extend from the routing line 110. Thus, the pad electrode 121 may be formed of a material that may be the same as that of the routing line 110. The pad cover electrode 122 may be disposed to cover the pad electrode 121 exposed by an insulation layer. The pad cover electrode 122 may be exposed by a touch barrier film. Thus, the pad cover electrode 122 may be connected to a signal transmission film with a touch driver mounted thereon. Here, the touch barrier film may be formed to cover the touch sensing line TS and the touch driving line TD, thereby reducing or preventing the organic light-emitting device 260 as well as the touch sensing line TS and the touch driving line TD from being damaged by external water or the like. The touch barrier film may be formed in a structure in which an inorganic insulation layer may be coated on an organic insulating film. A circular polarizer or an optical film, such as an organic light-emitting diode (OLED) transmittance controllable film (OTF), may be disposed on the touch barrier film.

Figure 4:
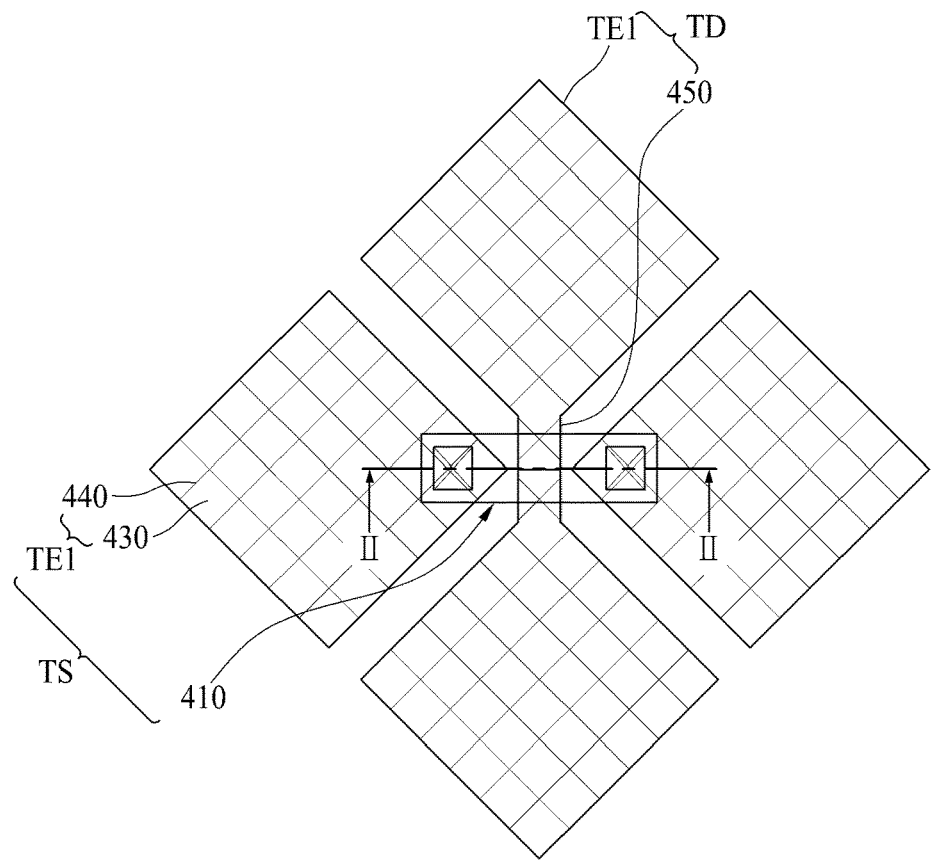
FIG. 4 is an enlarged view of FIG. 3, and illustrates a touch electrode layer according to an embodiment of the present disclosure.
Figure 5:
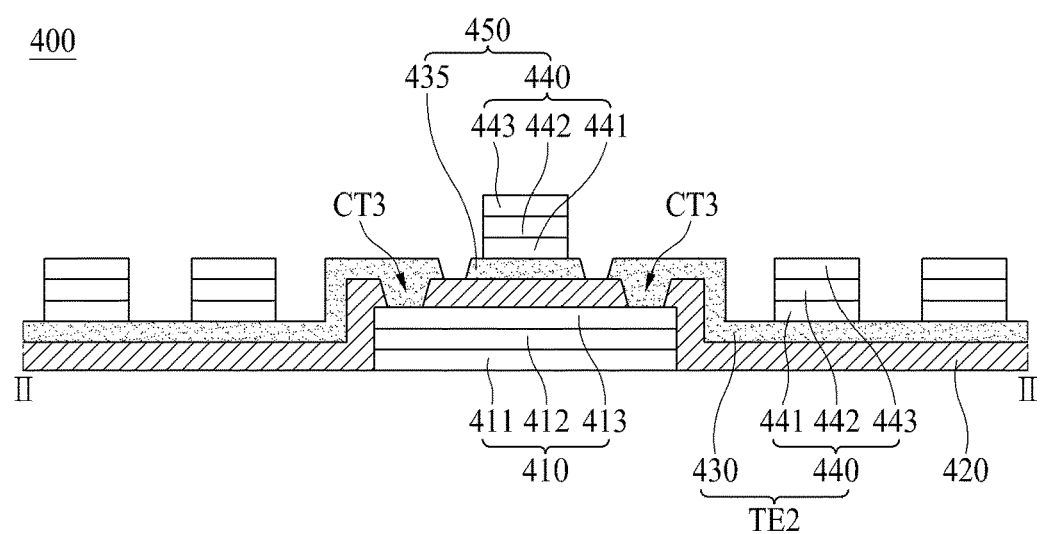
FIG. 5 is a cross-sectional view taken along line II-II of FIG. 4, and illustrates a touch sensing layer of an organic light-emitting display device according to an embodiment of the present disclosure.
Figure 6:
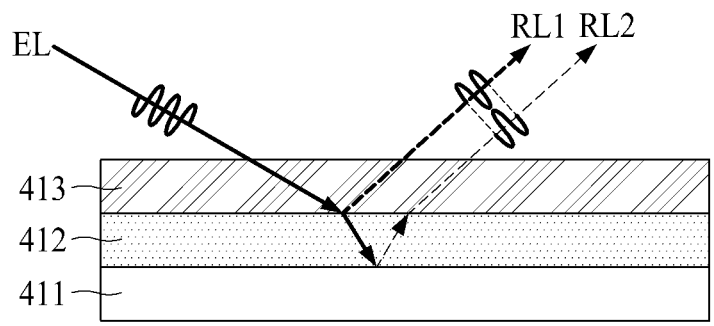
FIG. 6 is a diagram showing destructive interference of a second bridge and a mesh metal layer according to an embodiment of the present disclosure.

FIG. 4 is an enlarged view of FIG. 3, and illustrates a touch electrode layer according to an embodiment of the present disclosure. FIG. 5 is a cross-sectional view taken along line II-II of FIG. 4, and illustrates a touch sensing layer of an organic light-emitting display device according to an embodiment of the present disclosure. FIG. 6 is a diagram showing destructive interference of a second bridge and a mesh metal layer according to an embodiment of the present disclosure.

With reference to the examples of FIGS. 4 and 5, a touch sensing layer 400 of an organic light-emitting display device according to an embodiment of the present disclosure may include a second bridge 410, a touch insulation layer 420, a plurality of transparent conductive layers 430 and 435, a mesh metal layer 440, and a first bridge 450.

The second bridge 410 may be a bridge electrode that may electrically connect adjacent second touch electrodes TE2. The second bridge 410 may be provided on a layer different from the second touch electrodes TE2, and may electrically connect two adjacent second touch electrodes TE2 that may be separated from each other by the first bridge 450. In one example, the first bridge 450 and the second bridge 410 may be electrically disconnected from each other by the touch insulation layer 420.

The second bridge 410 may be electrically connected to the second touch electrodes TE2 through a contact hole CT3. Foe example, the second bridge 410 may be electrically connected to the transparent conductive layer 430 through the contact hole CT3 passing through the touch insulation layer 420. The second bridge 410 may be disposed to overlap a bank 270, thereby reducing or preventing an aperture ratio from being damaged by the second bridge 410.

The second bridge 410 may be directly provided on an upper surface of an encapsulation layer 300, and may include at least three metal layers. The second bridge 410 according to an embodiment of the present disclosure may include a reflective layer 411, a light path change layer 412, and a semi-transmissive layer 413.

The reflective layer 411 may be directly disposed on the upper surface of the encapsulation layer 300. The reflective layer 411 according to an embodiment may include, for example, molybdenum titanium (MoTi) or molybdenum (Mo). Because MoTi is high in adhesive force, MoTi may reduce or prevent the reflective layer 411 from being stripped from the encapsulation layer 300, and MoTi is low in reflectance.

The light path change layer 412 may be disposed on the reflective layer 411. The light path change layer 412 according to an embodiment may include, for example, ITO or IZO. The light path change layer 412 may include, in addition or alternatively, $SiO_2$, $SiN_x$, $Al_2O_3$, or the like.

With reference to the FIG. 6 example, the light path change layer 412 may be disposed between the reflective layer 411 and the semi-transmissive layer 413 to cause destructive interference based on a light path difference. For example, some of external light EL incident on the semi-transmissive layer 413 may be reflected as first reflection light RL1 by the light path change layer 412, and other light of the external light EL that passes through the light path change layer 412 without being reflected by the light path change layer 412 may be reflected as second reflection light RL2 to the reflective layer 411 via the light path change layer 412. However, the first and second reflection lights RL1 and RL2 may be dissipated by the destructive interference. As such, a thickness of the light path change layer 412 may be set for the first and second reflection lights RL1 and RL2 to be dissipated by destructive interference caused by a phase difference.

Therefore, in the second bridge 410 according to an embodiment of the present disclosure, destructive interference may occur in the external light EL incident by the light path change layer 412. For at least this reason, reflectance may be reduced. Accordingly, the organic light-emitting display device according to an embodiment of the present disclosure may lessen or prevent image visibility from being reduced at an outdoor place without a polarizer that is used in the related art, thereby enhancing image quality.

The semi-transmissive layer 413 may be disposed on the light path change layer 412. The semi-transmissive layer 413 according to an embodiment may include, for example, MoTi or Mo. The semi-transmissive layer 413 according to an embodiment of the present disclosure may be formed of the same material as that of the reflective layer 411. In this case, a thickness of the semi-transmissive layer 413 may be thinner than that of the reflective layer 411. Thus, the semi-transmissive layer 413 may semi-transmit external light incident thereon.

If the reflective layer 411 has a thickness of 500 Å or more, the second bridge 410 may have a reflectance of 10% or less of external light incident thereon. The following Table 1 shows a result value obtained by performing an experiment for checking a thickness-based reflectance difference of the reflective layer 411 with respect to the external light incident on the second bridge 410.

TABLE 1

| | Thickness | | | | |
|---|---|---|---|---|---|
| | 100 Å | 300 Å | 500 Å | 800 Å | 1,000 Å |
| Reflectance (%) | 15.342 | 11.094 | 9.732 | 8.687 | 8.935 |

With reference to Table 1, in the second bridge 410, if a thickness of the reflective layer 411 is 100 Å, then a reflectance is 15.342%; and if a thickness of the reflective layer 411 is 300 Å, then a reflectance is 11.094%, whereby the second bridge 410 has a reflectance of 10% or more. However, if a thickness of the reflective layer 411 is 1,000 Å, then a reflectance is 9.732% a thickness of the reflective layer 411 is 500 Å, a reflectance is 8.687% a thickness of the reflective layer 411 is 800 Å, and a thickness of the reflective layer 411 is 8.935%. Therefore, if a thickness of the reflective layer 411 is 500 Å or more, then the second bridge 410 has a reflectance of 10% or less. However, because the second inorganic layer 303 of the encapsulation layer 300 can be etched and damaged, a total deposition thickness of the second bridge 410 may be less than or equal to 2,000 Å.

The touch insulation layer 420 may be provided on the encapsulation layer 300 to cover the second bridge 410. The touch insulation layer 420 may be formed of an organic material or an inorganic material. If the touch insulation layer 420 is formed of the organic material, the touch insulation layer 420 may be provided, for example, through a coating process of coating the organic material on the encapsulation layer 300 and a curing process of curing the coated organic material at a temperature of 100° (degrees) C. or less. If the touch insulation layer 420 is formed of the inorganic material, the touch insulation layer 420 may be formed of the inorganic material, for example, deposited on the encapsulation layer 300 through a low temperature chemical deposition process and a cleaning process that may be alternately performed twice or more. Subsequently, the touch insulation layer 420 may be patterned, for example, through a photolithography process and an etching process. Thus, the contact hole CT3 may be formed.

The first bridge 450, the first touch electrodes TE1, and the second touch electrodes TE2 may be directly provided on an upper surface of the touch insulation layer 420. The first bridge 450 may overlap the second bridge 410. The first bridge 450 and the first and second touch electrodes TE1 and TE2 may include the transparent conductive layers 430 and 435 and the mesh metal layer 440.

The transparent conductive layers 430 and 435 may be disposed on the touch insulation layer 420. The transparent conductive layer 430 may be electrically connected to the second bridge 410 through the contact hole CT3 passing through the touch insulation layer 420.

The transparent conductive layers 430 and 435 according to an embodiment may each include an amorphous transparent conductive material, for example, amorphous ITO. For example, to reduce, prevent, or minimize a damage of the pixel array layer 200 caused by a process temperature for forming the transparent conductive layers 430 and 435, the transparent conductive layers 430 and 435 may be formed of the amorphous transparent conductive material through a low temperature deposition process using a process temperature of 100° (degrees) C. or less. That is, in an example in which the transparent conductive layers 430 and 435 are formed of a crystalline transparent conductive material, the pixel array layer 200 may be damaged by a high temperature thermal treatment process which may be performed for securing a low resistance value. Therefore, in an embodiment, the transparent conductive layers 430 and 435 may be formed of the amorphous transparent conductive material through a low temperature metal deposition process.

The mesh metal layer 440 may be disposed on the transparent conductive layers 430 and 435. The mesh metal layer 440 may include at least three metal layers. The mesh metal layer 440 according to an embodiment of the present disclosure may include a reflective layer 441, a light path change layer 442, and a semi-transmissive layer 443.

The reflective layer 441 may be provided on the transparent conductive layer 430. The reflective layer 441 according to an embodiment may include, e.g., MoTi or Mo. MoTi may be high in adhesive force and may be low in reflectance.

The light path change layer 442 may be disposed on the reflective layer 441. The light path change layer 442 according to an embodiment may include ITO or IZO. The light path change layer 442 may include, in addition or alternatively, $SiO_2$, $SiN_x$, $Al_2O_3$, or the like. The light path change layer 442 may be disposed between the reflective layer 441 and the semi-transmissive layer 443 to cause destructive interference based on a light path difference. Therefore, in the mesh metal layer 440 according to an embodiment of the present disclosure, destructive interference may occur in external light incident by the light path change layer 442. For at least this reason, reflectance may be reduced. Accordingly, the organic light-emitting display device according to an embodiment of the present disclosure may reduce or prevent image visibility from being reduced at an outdoor place without the polarizer of the related art, thereby enhancing image quality.

The semi-transmissive layer 443 may be disposed on the light path change layer 442. The semi-transmissive layer 443 according to an embodiment may include, for example, MoTi or Mo. The semi-transmissive layer 443 according to an embodiment of the present disclosure may be formed of the same material as that of the reflective layer 441. In this case, a thickness of the semi-transmissive layer 443 may be thinner than that of the reflective layer 411. Thus, the semi-transmissive layer 443 may semi-transmit external light incident thereon.

The mesh metal layer 440, the first bridge 450, and the plurality of first and second touch electrode TE1 and TE2 including the mesh metal layer 440 may have a reflectance of about 10% with respect to external light incident thereon in an example in which a thickness is 500 Å or more. Accordingly, using a low reflection metal layer stacking structure, the organic light-emitting display device according to an embodiment of the present disclosure may reduce or prevent reflection of external light without a polarizer, thereby reducing the manufacturing cost, preventing the loss of luminance caused by the polarizer, and enhancing image quality.

In the organic light-emitting display device according to an embodiment of the present disclosure, the touch insulation layer 420 and the first and second touch electrodes TE1 and TE2 may be directly disposed on the encapsulation layer 300. Accordingly, in comparison with the related art organic light-emitting display device in which a touch screen is adhered to the organic light-emitting display device by an adhesive, according to an embodiment, an adhesive process may be unnecessary. Thus, a manufacturing process may be simplified, and a manufacturing cost may be reduced in embodiments of the present disclosure.

Figure 7:
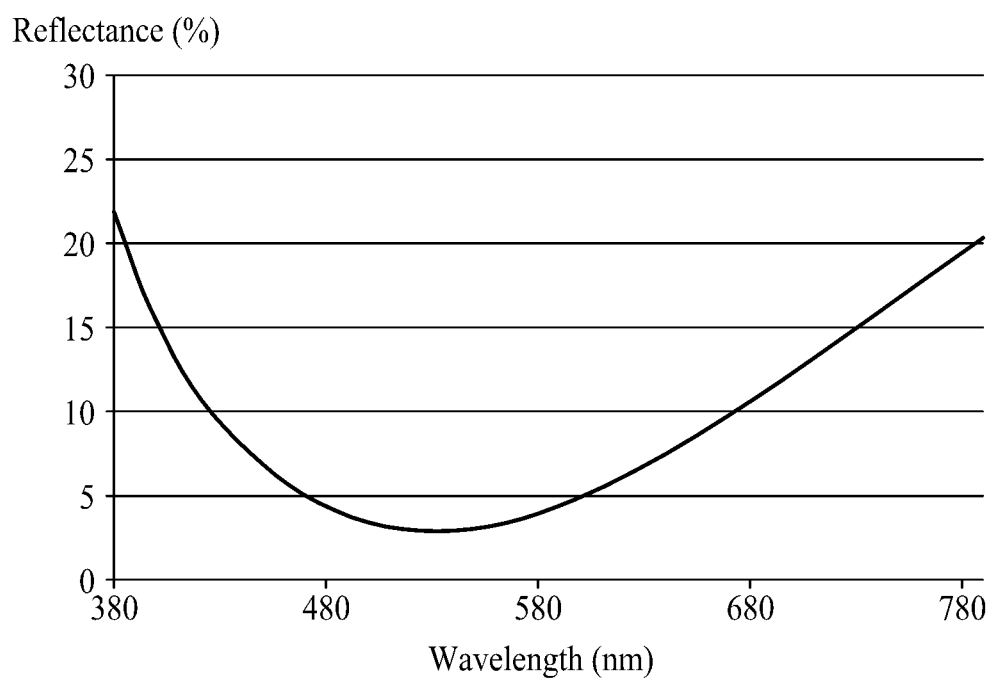
FIG. 7 is a graph showing an external light reflectance of a reflective layer according to an embodiment of the present disclosure with respect to a wavelength.

FIG. 7 is a graph showing an external light reflectance of a reflective layer according to an embodiment of the present disclosure with respect to a wavelength.

FIG. 7 shows a wavelength-based reflectance (%) when the reflective layer 411 includes MoTi and may have a thickness of 1,000 Å. With reference to FIG. 7, a reflectance (%) of the reflective layer 411 may be 10% or less in blue, green, and red wavelength ranges (e.g., about 430 nm to 680 nm).

As described above, because destructive interference may occur in incident external light due to the light path change layer, an external light reflectance of each of the second bridge, the first bridge including the mesh metal layer, and the plurality of first and second touch electrodes according to the embodiments of the present disclosure may be reduced.

In the organic light-emitting display device according to embodiments of the present disclosure, because the low reflection metal layer stacked structure may be applied, reflection of external light may be reduced or prevented without a polarizer, thereby decreasing the cost, lessening or preventing luminance from being reduced by the polarizer, and enhancing image quality.

Moreover, in the organic light-emitting display device according to the embodiments of the present disclosure, the first and second touch electrodes may be directly disposed on the encapsulation layer. Therefore, in comparison with the related art organic light-emitting display device in which a touch screen is adhered to an organic light-emitting display device by an adhesive, in embodiments of the present disclosure, an adhering process may be not needed, and thus, a process may be simplified, and the cost may be reduced.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. An organic light-emitting display device, comprising:
   a substrate;
   a pixel array layer on the substrate, the pixel array layer comprising a plurality of pixels, each of the plurality of pixels comprising an organic light-emitting device;
   an encapsulation layer covering the pixel array layer; and
   a touch sensing layer on the encapsulation layer, the touch sensing layer comprising:
      a plurality of first touch electrodes; and
      a plurality of second touch electrodes,
      wherein the plurality of first and second touch electrodes each comprise:
         a transparent conductive layer on an upper surface of the encapsulation layer, and
         a mesh metal layer on the transparent conductive layer, the mesh metal layer comprising at least three metal layers, and
      wherein the mesh metal layer comprises:
         as a first metal layer among the at least three metal layers, a reflective layer on the transparent conductive layer,
         as a second metal layer among the at least three metal layers, a light path change layer on the reflective layer, and
         as a third metal layer among the at least three metal layers, a semi-transmissive layer on the light path change layer.

2. The organic light-emitting display device of claim 1, wherein each of the plurality of first and second touch electrodes has a reflectance of 10% or less of external light incident thereon.

3. The organic light-emitting display device of claim 1, wherein the semi-transmissive layer is thinner than the reflective layer.

4. The organic light-emitting display device of claim 3, wherein a material of the reflective layer is the same as a material of the semi-transmissive layer.

5. The organic light-emitting display device of claim 1, wherein the reflective layer comprises one or more of: molybdenum titanium (MoTi) and molybdenum (Mo).

6. The organic light-emitting display device of claim 1, wherein the light path change layer comprises one or more of: indium tin oxide (ITO) and indium zinc oxide (IZO).

7. The organic light-emitting display device of claim 1, further comprising:
   a bridge configured to connect adjacent second touch electrodes, the bridge being directly on the upper surface of the encapsulation layer and comprising a metal layer comprising at least three layers of metal.

8. The organic light-emitting display device of claim 7, further comprising:
   a touch insulation layer on the encapsulation layer, the touch insulation layer being configured to cover the bridge,
   wherein the plurality of first touch electrodes and the plurality of second touch electrodes are directly on an upper surface of the touch insulation layer.

9. The organic light-emitting display device of claim 7, wherein the bridge has a thickness in a range of 500 Å~2,000 Å.

10. A method of manufacturing an organic light-emitting display device, the method comprising:
    providing a substrate;
    providing a pixel array layer on the substrate, the providing the pixel array layer comprising providing a plurality of pixels, each of the plurality of pixels comprising an organic light-emitting device;
    covering the pixel array layer with an encapsulation layer; and
    providing a touch sensing layer on the encapsulation layer, the providing the touch sensing layer comprising:
       providing a plurality of first touch electrodes; and
       providing a plurality of second touch electrodes,
       wherein the providing the plurality of first and second touch electrodes each comprise:
          providing a transparent conductive layer on an upper surface of the encapsulation layer, and
          providing a mesh metal layer on the transparent conductive layer, the mesh metal layer comprising at least three metal layers, and
       wherein the providing the mesh metal layer comprises:
          providing, as a first metal layer among the three metal layers, a reflective layer on the transparent conductive layer,
          providing, as a second metal layer among the three metal layers, a light path change layer on the reflective layer, and
          providing, as a third metal layer among the three metal layers, a semi-transmissive layer on the light path change layer.

11. The method of claim 10, wherein each of the plurality of first and second touch electrodes has a reflectance of 10% or less of external light incident thereon.

12. The method of claim 10, wherein the semi-transmissive layer is thinner than the reflective layer.

13. The method of claim 12, wherein a material of the reflective layer is the same as a material of the semi-transmissive layer.

14. The method of claim 10, wherein the reflective layer comprises one or more of: molybdenum titanium (MoTi) and molybdenum (Mo).

15. The method of claim 10, wherein the light path change layer comprises one or more of: indium tin oxide (ITO) and indium zinc oxide (IZO).

16. The method of claim 10, further comprising:
providing a bridge connecting adjacent second touch electrodes, the bridge being directly on the upper surface of the encapsulation layer and comprising a metal layer comprising at least three layers of metal.

17. The method of claim 16, further comprising:
providing a touch insulation layer on the encapsulation layer, the touch insulation layer covering the bridge,
wherein the plurality of first touch electrodes and the plurality of second touch electrodes are provided directly on an upper surface of the touch insulation layer.

18. The method of claim 16, wherein the bridge has a thickness in a range of 500 Å~2,000 Å.

\* \* \* \* \*